United States Patent [19]

Boden et al.

[11] Patent Number: 4,818,500

[45] Date of Patent: Apr. 4, 1989

[54] METHOD OF AND APPARATUS FOR GROWING CRYSTALS

[75] Inventors: Karl Boden, Julich; Harald Ibach, Aachen-Verlautenheide; Udo Linke, Duren, all of Fed. Rep. of Germany

[73] Assignee: Kernforschungsanlage Julich Gesellschaft Mit Beschrankter Haftung, Julich, Fed. Rep. of Germany

[21] Appl. No.: 905,272

[22] Filed: Sep. 8, 1986

Related U.S. Application Data

[62] Division of Ser. No. 772,558, Sep. 4, 1985, Pat. No. 4,708,764.

[30] Foreign Application Priority Data

Sep. 4, 1984 [DE] Fed. Rep. of Germany ....... 3432467
Aug. 9, 1985 [DE] Fed. Rep. of Germany ....... 3530417

[51] Int. Cl.$^4$ .............................................. C30B 15/30
[52] U.S. Cl. .................................... 422/249; 422/245; 156/601; 156/617.1; 156/618.1
[58] Field of Search ............... 156/601, 616 R, 617 R, 156/617 SP, 618; 422/249

[56] References Cited

U.S. PATENT DOCUMENTS

| | | | |
|---|---|---|---|
| 2,664,496 | 12/1953 | Brace | 422/249 |
| 3,074,785 | 1/1963 | Gremmelmaier | 422/249 |
| 3,203,768 | 8/1965 | Tiller et al. | 422/249 |
| 3,211,881 | 10/1965 | Jablonski et al. | 156/620 |
| 4,284,605 | 8/1981 | Pierrat | 422/249 |

FOREIGN PATENT DOCUMENTS 993880 6/1965 United Kingdom ............... 422/249

*Primary Examiner*—John Doll
*Assistant Examiner*—Robert M. Kunemund
*Attorney, Agent, or Firm*—Herbert Dubno

[57] ABSTRACT

A complex relative movement in a direction transverse to the crystal drawing direction is imparted at the interface between the growing crystal bar and a melt of the crystallizable material by controlled electrical energization of a radial stabilizer acting upon the magnetizable core by which either the bar or the crucible or a supply bar for the material, or both, can be suspended.

3 Claims, 8 Drawing Sheets

METHOD OF AND APPARATUS FOR GROWING CRYSTALS

This is a divisional of co-pending application Ser. No. 772,558 filed on Sept. 4, 1985, now a U.S. Pat. No. 4,708,764.

CROSS REFERENCE TO RELATED APPLICATIONS

This application is related to our commonly assigned, concurrently filed copending application Ser. No. 772,557 and to the German application P No. 34 32 467.4 filed 4 September 1984 upon which that application is based.

FIELD OF THE INVENTION

Our present invention relates to a process for producing crystalline bodies, especially a monocrystalline bar, from a melt which can be formed in a crucible or formed by the melting of a supply bar and wherein, to improve homogeneity of distribution of doping materials or the like, a substantially two-dimensional mixing of the melt material is effected in the region at which the crystal is drawn or grown.

BACKGROUND OF THE INVENTION

Crystalline bars or, in general, monocrystals which may be of considerable importance in the semiconductor arts, can be grown by allowing the crystal to develop between a seed crystal or a bar of the previously developed crystal and a melt of the material from which the crystal is to be grown, the melt being supplied by zone-melting processes or from a crucible in which the molten material is maintained, e.g. based upon the Czochalski crucible melt process described in German patent document DE-OS No. 16 44 020. It is known that an intimate two-dimensional mixing, i.e. a mixing substantially in the plane of the interface between the bar and the melt has the advantage of improving the crystal quality and of providing a substantially uniform distribution of resistance over the entire cross section of the crystal body. It appears that this is a result of a more homogeneous distribution across the cross section of the body of the doping materials which may be present in the melt.

Customarily this intimate two-dimensional mixing is effected by imparting a rather complex relative movement to the source member, e.g. the crucible or the bar from which the material is melted, and the monocrystalline bar which is produced, this complex movement being a result, for example, of a hypercycloidal path of the seed crystal or the bar or a similar movement of the crucible.

The axes of the bar and the crucible, although parallel, can then be offset from one another and both the crucible and the bar can be rotated about the respective axes so that the relative movement corresponds to the hypercycloidal path.

When such systems in which mechanical drives are coupled through solid members with the bar and the crucible, it is not possible to avoid external influences upon the crystal-growing region so that, for example, vibrations or shocks can be transmitted to the crucible or to the growing crystal.

OBJECTS OF THE INVENTION

It is, therefore, the principal object of the invention to provide a method of growing a crystal, utilizing either zonemelting or crucible-melting principles, which permits an intimate two-dimensional mixing with the advantages described but free from the drawbacks of earlier systems as enumerated above.

Another object of this invention is to provide a simplified way of relatively displacing the crystal-growing member relative to the melt-source member to effect two-dimensional mixing without the danger that shocks, vibrations and other disadvantageous effects can be transmitted to the crystal-growing region.

Still another object of the invention is to provide a method which enables a relative movement of the two members during the crystal-growing process without the problems characterizing earlier systems.

Still another object of the invention is to provide an improved method of growing crystals which allows hypocycloidal, hupercycloidal, epicycloidal and other complex motion patterns to be superimposed on the crystal-growing zone.

SUMMARY OF THE INVENTION

These objects and others which will become apparent hereinafter are attained, in accordance with the invention, by providing at least one of the members, i.e. the crystal-growing bar member or the material-source member, with an axially extending core cooperating with an axial stabilizing magnet to position this core axially with respect to a support, and at least one radial stabilizer for the core, this stabilizer having electromagnet means including at least one electromagnet spacedly juxtaposed with the core, a position sensor responsive to the position of the core and an electronic circuit controlled by the position sensor for controlling, in turn, the energization of the electromagnet.

According to the invention the electronic controller is energized with signals which effect a controlled displacement of the magnetizing core so that movements corresponding to these superimposed signals are imparted at the crystal-growing interface with practical instantaneous detection by the position source which ensures accurate adherence to the movement pattern, the movements generated by the energization of the controller or the electromagnets of the radial stabilizer being periodic vibrations and/or rotary movements in either sense of rotation and/or statically and/or periodically varying movements generated by the application of single phase or multiple phase alternating current magnets.

Since there is not contact mechanically with the core and the latter is fully suspended magnetically in a frictionless environment, the crystal body and the crucible or the supply bar can remain free from vibration, chattering or shock effects which may be generated externally of the device.

While in the aforementioned patent application the radial stabilizer is used to establish a fixed radial orientation even during axial displacement of the growing crystal bar to effect axial growth, an axial displacement which can be effected by the axial stabilizing magnet the axial displacement thereof, with the present invention we intentionally impart electrical signals to the electromagnets to displace the core in a predetermined manner which, because of the presence of the position sensors, can not only be reproducible, but can accurately be determined to avoid nonhomogeneous crystalline structures.

When a housing is required for the crystal growth chamber or zone, this housing can be provided within the radial stabilizer unit and the axial stabilizing magnet, thereby eliminating the need to displace the housing with the axially movable structure, or the housing can be so displaceable. Nevertheless, systems of the type described in German Pat. No. 23 06 755, which may involve friction, can be avoided. In general it can be said that the invention is applicable to systems with and without housings of this type.

In the case in which a housing is used, e.g. in the form of a high pressure, hermetically sealed housing, the wall of the housing to the extent that it lies in a gap which is crossed by a magnetic field, should be composed of a nonmagnetic and nonmagnetizable material.

Problems with sliding or other seals in regions of the housing wall can be entirely eliminated together with sliding friction since the apparatus of the invention is free from mechanical contact with the axially moving parts and, as a consequence, the highest purity atmospheres can be maintained in the housing.

According to a feature of the invention, the motion imparted to the magnetizable core is a result of the superimposition of electromagnetic static and dynamic fields which are generated periodically by the radial stabilization units. Asymmetric changes of the radial field, where the magnetizable core is suspended to permit rotations and radial movement, result in an oscillatory movement to the extent that they periodically are one-sided, although periodically applied rotary fields will result in a rotation of the core and even a rotation of the axis of the core about a further axis of rotation, i.e. the gyration of the core. By the superimposition of such radial displacement and rotary or gyratory movements, controlled by the nature of the fields which are superimposed to the radial stabilizer, we are able to vary over a wide range of complexity, the movements imparted at the crystallization interface, the magnitudes of these movements and the frequencies thereof, we have, for example, been able to generate epicyclic and hypercyclic motions as well as simple eccentric rotations and even axial oscillatory movements alone or in combination with any of the motions described.

Naturally, a radial displacement of the crystalline body can also be effected by imparting mechanical movement to the outwardly disposed magnetic elements of the radial stabilizer, the motions being then transmitted to the magnetizable core and the bar supported thereby through the gap or space bridged by the magnetic field.

The radial disalignment of the magnetizable core during the process of the invention can be used to bring about the motions described independently of whether the core is connected to the crystalline body, the crucible or the supply bar or member.

The alternating current or multiple phase rotary field current applied to the radial stabilizing electromagnets can be superimposed upon the field controlled by the position sensor or position sensors and generated by the electrical control units in response thereto. These signals form disturbances to the control of the position of the core by effectively causing the core to deviate from the setpoint position. The control unit will then be effective to bring the core back to the setpoint position and the result is thus an oscillation which may be sufficient to effect the two-dimensional mixing previously described.

However, it is possible in accordance with the invention, to not only superimpose a perturbation or disturbance signal on the controller for the position of the magnetic core, but also to ensure that a residual deviation will remain, i.e. that the restoration will not be precisely at the original setpoint. To this end we can use, for example, an appropriate controller such as a P-D (proportional-differential) controller which permits a deviation from the setpoint position to remain. By appropriate choice of the disturbance signal we are able to select the remaining deviation from the original setpoint position and thus provide a desired degree of control of the movement pattern of the magnetizable core.

It has also been found to be advantageous in the process of the invention to generate a predetermined movement pattern of the magnetizable core with structurally and/or periodically varying alternating current or rotary field or multiple currents, providing a control signal in each control unit corresponding to the desired static or time-variable setpoint position in accordance with the desired movement pattern.

In other words, while in the previously described embodiment we impart the desired pattern or movement to the core by superimposition upon the automatic control, a disturbance in the embodiment is now described. We achieve this by a variation of the setpoint value which is delivered to the comparator in the control unit or in each of the control units.

Since the setpoint values will change, the corresponding setpoint positions of the magnetic core to be similarly altered and the hunting of the time-changing setpoint position by the core will ensure the desired pattern of movement thereof.

The control unit, depending upon the nature of the time variation of the predetermined setpoint position and the type of controller used can bring the magnetizable core directly into the desired setpoint position or can bring it into the desired position with a selected degree of delay. The particular predetermined setpoint position can thus deviate from the original setpoint position structurally by a jump or step function, a sine function or some other preselected function.

When the crystalline body as well as the crucible, or both the control bar being formed and the supply bar, are provided with respective magnetic cores, each of the cores can be subject to such controlled movement so that these movements superimposed upon one another can be far more complex in spite of the fact that relatively simple radial stabilization units are used.

Such a radial stabilizing unit generally comprises tow sensors and electromagnet pairs, with each two sensors operating into a respective control unit. The two sensors and electromagnets of the pair can be disposed opposite one another and the two pairs can be disposed at right angles to one another.

In a particularly advantageous embodiment of the invention, displacement signals of the same frequency are applied to the control unit and different phase or amplitude on both from one control unit to the other.

A phase shift with two signals of the same amplitude and frequency applied to the two pairs of coils lying at right angles to one another will result in the generation of lissajous figures.

The movements of the magnetizable core can generate at the intersection of the core axis with the plane of the radial stabilizer, an elliptical movement with fixed major and minor axes.

However, it is possible to generate a variety of movements ranging from a purely circular movement (a phase angle of 90° and the same amplitude between the signals) to a purely translational movement (phase angle 0°).

When the control units are supplied with control signals which change with time, it is possible to shift one of the frequencies while the other signal has a constant frequency and amplitude, movements can be generated ranging from simple to complex lissajous figures.

Other parameters of the signals can be altered for even more complex effects.

When, for example, two radial stabilizing units are provided for each core in different planes, still more complex movements may be imparted to the magnetizable core, e.g. in the form of nutating or wobble movements since the axis can then be displaced out of the vertical.

One of the important features of the invention is that it is possible to provide a number of patterns of the crystallizing body, the crucible or the support member in a reproducible and disturbance-free manner.

We can, furthermore, provide a force-measuring device directly below the axial stabilizing magnet, or the linear motor, or the assembly of the linear motor and the electromagnets of the radial stabilizer or to the hollow structure, to respond to the weight increase of the growing crystalline body and to enable control of the crystal-growing parameters.

When the crystalline body is surrounded, moreover, with a growth chamber, practically all of the parameters influencing the growth process can be established instantaneously and varied independently from one another.

The invention, therefore, not only optimizes the movement patterns and movement of the crystalline body during crystal growth, but also other aspects of the growth process, even permitting control of crystal growth and doping as well as enabling new crystal types to be grown.

The method of the invention can be carried out utilizing an apparatus which has a radial stabilizer unit surrounding the magnetizable core so that an annular gap is provided between the two. A radially directed premagnetization can be provided in this gap, e.g. contributed in part by a permanent magnet which may lie adjacent the radial stabilizer, so that the magnetic field strength generated by the electromagnets of the radial stabilizer can be reduced or the annular gap increased to a width in excess of, say, 20 mm which can accommodate the magnetizable wall of a high pressure chamber surrounding the growth compartment.

To prevent sublimation or condensation of the volatile components, all surfaces exposed in the growth chamber must be maintained at a temperature above the sublimation or condensation point and this is effected by heating the chamber walls by the tempering elements mentioned previously and described in greater detail below. The inner surfaces at least of the chamber walls are preferably composed of quartz glass and graphite and it is possible to coat both the magnetizable core or any exposed surfaces within the growth chamber with quartz glass or graphite to minimize corrosion phenomena.

According to a further feature of the invention, the axial stabilizing magnet is so disposed that it is located directly above the electromagnets of the radial stabilizing unit so that is magnetic field is superimposed upon the radial stabilizing magnet field in the gap of the latter unit and provides the premagnetization.

The displacement in the axial direction of the device for growth of the crystal can be effected in various ways. For example, the stabilizing magnet can be mounted in a fastening frame which in turn can be supported and can be axially displaced relative to a support, e.g. by a threaded spindle or fluid-cylinder drive.

An especially elegant way of effecting the axial displacement, according to the invention, is to provide an electromagnetic linear motor which acts upon the magnetizable core so that both the axial stabilization and the axial displacement can be effected by magnetic field forces. Obviously this arrangement eliminates the need for any mechanically movable parts.

It has been found to be advantageous, moreover, to provide an annular rotary field stator around the magnetizable core and defining an annular gap therewith. This allows a rotation to be superimposed upon the axial displacement of the core as may be desirable for the growth of certain qualities in monocrystals.

Because the force-measuring unit is acted upon by the outer or magnetic component of the suspension and the suspension is coupled exclusively by magnetic field forces to the core and to the crystal, the detection of the crystal weight gain is effected in a completely frictionless manner.

The force-measuring unit can be provided between a support and the aforementioned stator. Especially when the growth chamber is completely enclosed and hermetically sealed, the means for measuring the growth of the crystal and hence controlling the parameters of the crystal drawing apparatus can be free from the effects of corrosion, pressure, growth temperature and even phenomena resulting from the use of slip ring so that the weight change measurement can be obtained without perturbations, signal drift and the effects of friction phenomena with high precision and stability. The control of the crystal-growing operation is thereby greatly enhanced.

The growth-measuring unit is thus also comparatively simple and inexpensive since all need for slip rings, feed-through devices in the pressure vessel shielding, additional cooling units and means for protecting the measuring unit against corrosion or for compensation for distortions of the measured values can be eliminated.

The force-measuring unit can be provided directly below the axial stabilizing magnets or the linear motor or under the entire assembly of the linear motor, radial stabilizing units or like structures.

These structures can be included in a hollow cylindrical stator which can form part of a rotary drive motor although the rotary drive motor need not be used.

A precise measurement of the weight change of the crystalline body is especially advantageous for control of the crucible melt crystal-drawing process according to Czochalski: Because of the economics of the method and the crystal quality required, the monocrystal must be drawn over the usable length with a constant diameter. The parameters which control the diameter of the growing crystal most significantly are the melt temperature and the axial speed of movement of the crystal and these parameters must be continuously controlled over long periods of time. One of the actual value measurements useful for this purpose is the weight change of the growing crystal and it is for this reason that the actual value of this weight change is detected, compared with a setpoint value and the difference between the setpoint and the actual values determined. The difference signal is used to control the heating of the melt and/or the speed of the axial displacement.

Since the measured weight change is extremely small and by comparison to the friction forces which arose in earlier systems, it has not been practical to provide a detect-free measurement in the past of the actual weight change sufficient for control purposes. This is especially problematical when the measuring device must be subjected to thermal effects and other phenomena causing signal drift, or where slip rings were required because the crystal was rotated during growth. All of these detrimental influences are eliminated according to the invention which also avoids the danger of leakage.

BRIEF DESCRIPTION OF THE DRAWING

The above and other objects, features and advantages of the present invention will become more readily apparent from the following description, reference being made to the accompanying drawing, in which.

SPECIFIC DESCRIPTION

Figure 1:
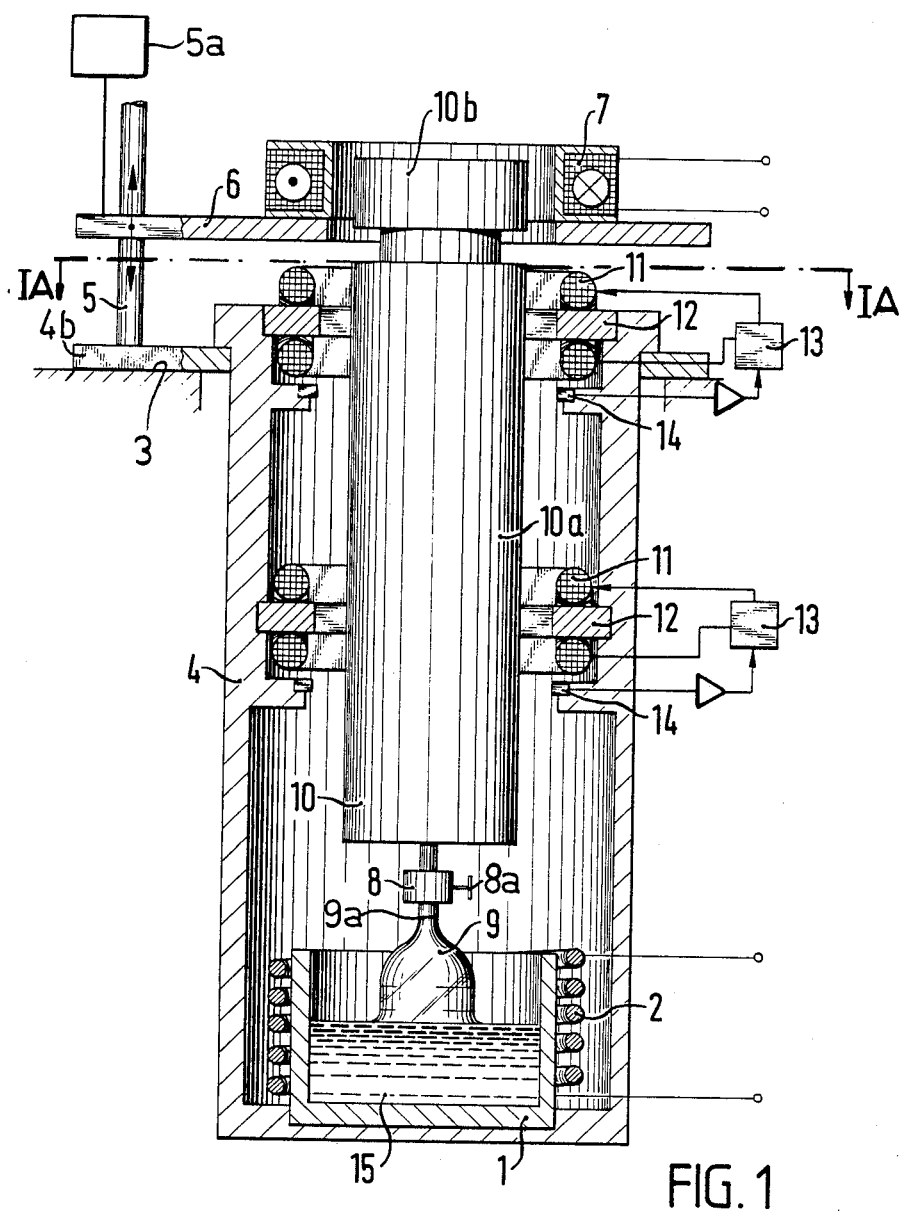
FIG. 1 is a vertical section through an apparatus for drawing a crystal from a crucible in which the seed crystal is displaced with respect to the stationary crucible and provided with a magnetic holder arrangement for the device carrying the seed crystal according to the invention.
Figure 1A:
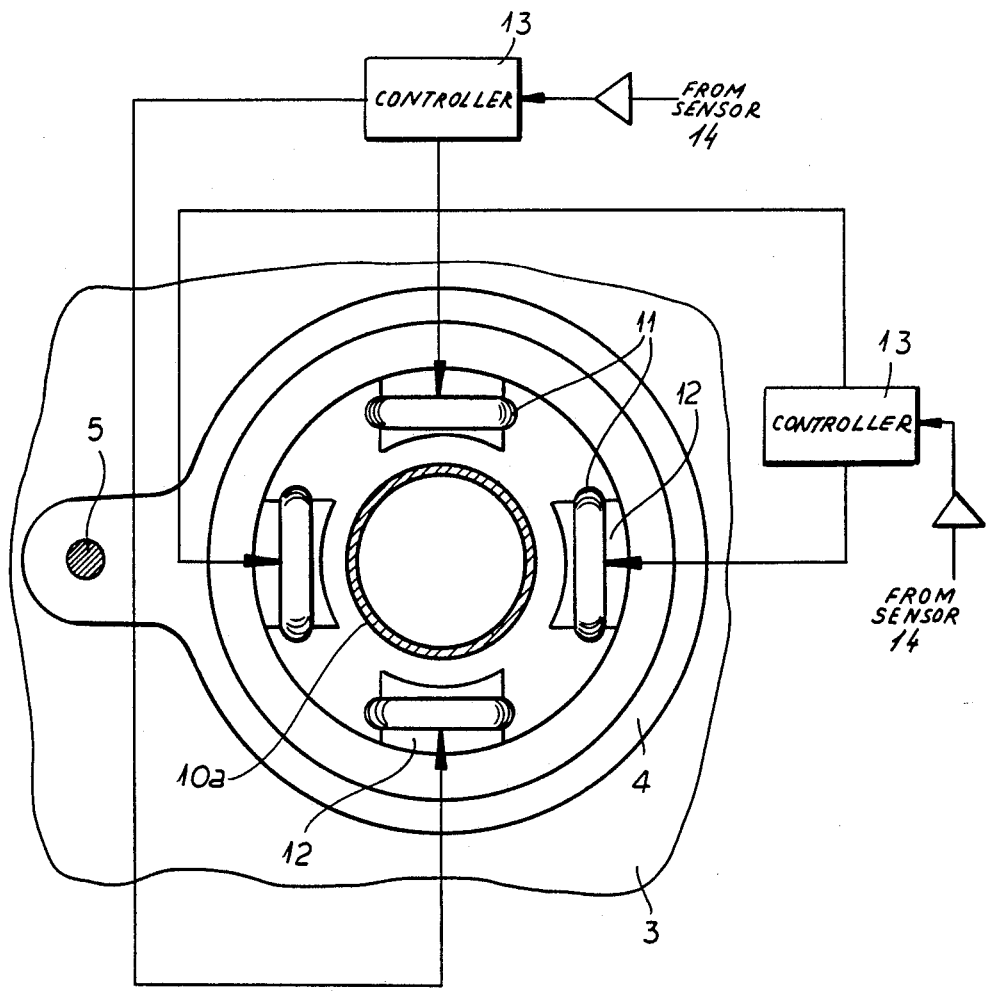
FIG. 1A is a section generally along the line IA-IA of FIG. 1.

The apparatus shown in FIGS. 1 and 1A comprises a melting crucible 1 provided with a resistance heater 2 for maintaining a melt 15 of the material, e.g. a III-V melt silicon or germanium, from which a bar 9 of the material is the be drawn utilizing a seed crystal 9a removable attached to the apparatus by a holder 8 which is shown to have a screw 8a allowing the seed crystal to be fixed in place.

The melting crucible 1 is shown to be seated in the base of a frame 4 which is supported by a flange 4a upon a bracket 4b resting upon a fixed support 3. The frame 4 is also referred to as a fastening frame since other parts of the radial stabilization system of the invention are affixed therein or thereto.

The bracket 4b serves to mount a post 5 of a raising and lowering unit which includes a holding plate 6 and a vertical drive 5a shown only diagrammatically in this Figure. The holding plate 6 carries an electromagnetic coil 7 which has a magnetizable core 10 whose upper portion 10b is a cylindrical permanent magnet and can be received in the coil 7. The lower portion of this core 10 is a hollow elongated magnetizable cylinder 10a composed of stainless steel which is magnetically attractable.

The electromagnet coil 7 is positioned at such a height that it surrounds the permanent magnet 10b and upon energization can fix the electromagnet core 10b in its axial relationship to the coil 7. The upward movement of the plate 6 is effected by the drive 5a which can be an electric motor-threaded spindle drive or a hydraulic cylinder drive.

Two radial stabilizers are provided in the support frame 4, each comprising four coils 11 with ferromagnetic cores 12.

These coils and the respective cores are disposed in opposing pairs of which only the pair of each stabilizer unit in the plane of the drawing has been illustrated in FIG. 1 although all four coils of the upper stabilizer can be seen in FIG. 1A.

These coils are connected to respective electronic controllers 13 in pairs and are engaged by a direct current whose level is dependent upon a measurement signal derived from the inductive sensors 14 and supplied through the controllers 13.

Figure 1B:
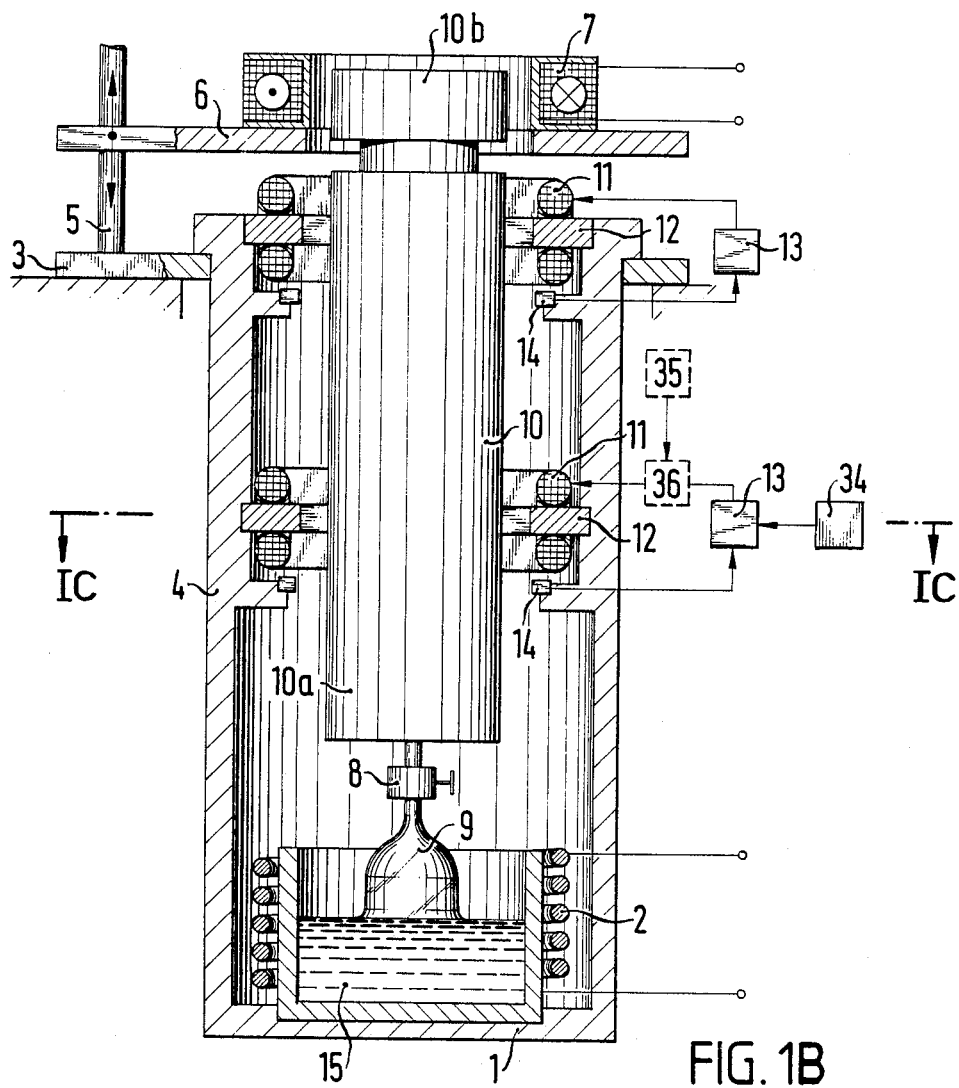
FIG. 1B is a diagrammatic section similar to FIG. 1 but showing additional components for controlling the movement pattern according to the invention.
Figure 1C:
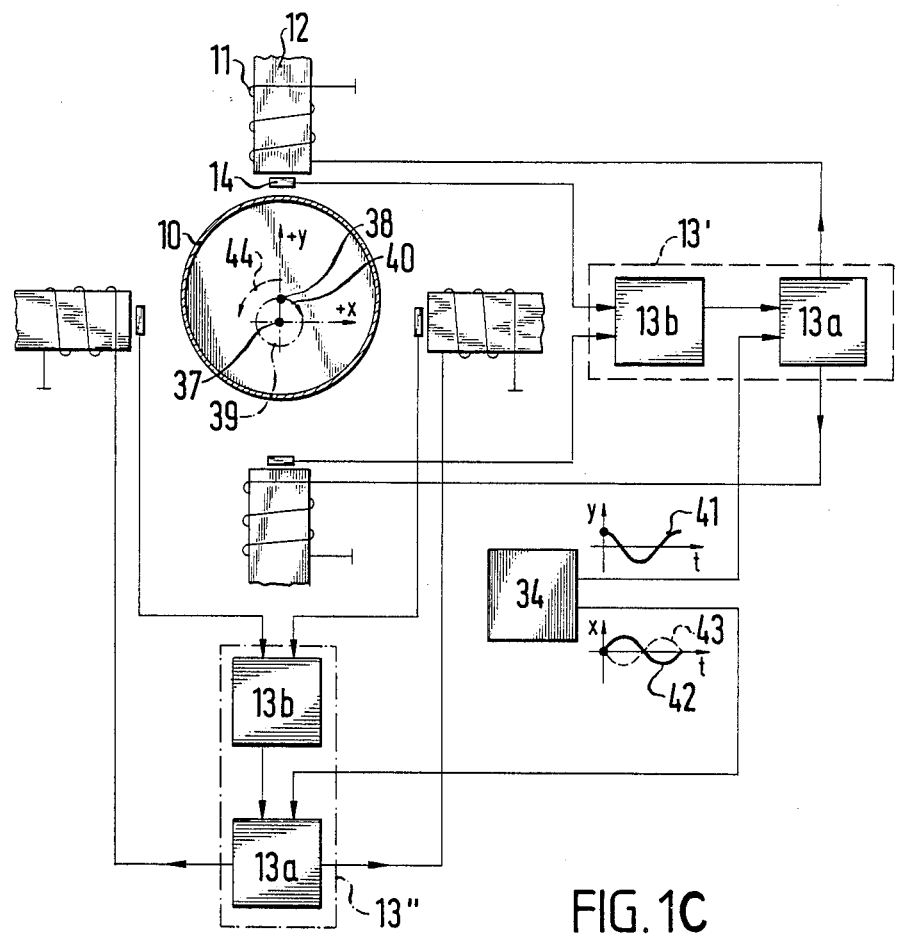
FIG. 1C is a section taken along the line IC-IC of FIG. 1B.

The signals from the inductive sensors are amplified and are subject to a phase shift before being supplied as output signals in the form of a regulated direct current by the controllers 13 to the coils 11 (see discussion of FIGS. 1B and 1C).

During the production of a crystal bar, the crystal 9 is drawn from the melt 15 by vertical movement of the core 10 to which the holder 8 is affixed by energization of the electromagnet 7 and displacement of the plate 6 in the upward direction. The core is centered along the desired axis of the radial stabilizer by magnetic arrays and is maintained precisely vertical by the two vertically spaced radial stabilizers which monitor any radial deviation from proper axial positioning of the core and automatically adjust the fields of the magnet 11 to precisely position the core with concentricity.

FIGS. 1B and 1C are provided to show a radial stabilizer unit of the embodiment previously described or one of those described below which can be modified to impart thereto a two-dimensional movement which is so important to the present invention.

In FIGS. 1B and 1C, the lower radial stabilizer has been shown to be provided with the additional circuitry although it should be clear that both radial stabilizers have been provided with the same circuitry which can effect identical movements in both radial stabilization planes, or the movement at the crystallization interface can be made more complex by imparting phase-shifting or different patterns of movement in the two pairs.

Furthermore, where both the crucible and the drawn bar, or both the zone-melting and supply bars are provided with magnetic cores, they can be moved with different patterns to further complicate the motion pattern of the region of crystallization interface.

FIGS. 1B and 1C illustrate two embodiments of the process of the invention. In a first embodiment electrical disturbance signals are supplied directly to the coil 11 which has a controller 13 for restoring its setpoint position. The generation of this disturbance signal is represented by the generator 35 which feeds its signals through an isolation unit represented in broken lines at 36 to the coils 11 of the radial stabilizer.

In the second approach, a periodic variation of the setpoint value is delivered to the generator 34 to the control unit 13 to provide a static or time-varying change in the setpoint value.

Both the units 34 and 35 may be provided in any given apparatus and used alternatively for different patterns.

For example, the disturbance signal introduced by the generator 35 causes a deviation of the magnetic core 10 from its setpoint position.

Of course the sensor 14 will detect the deviation of the core from its setpoint position and act upon the controller 13 to correct this setpoint. A residual disturbance signal can be provided by the isolator 36 or, alternatively, controller 13 can include a PD controller leaving a residual offset of the setpoint value so that with repeated disturbance signal corrections, a predetermined pattern of movement around the original setpoint value can be ensured and the desired intimate two-dimensional mixing achieved.

Additional disturbance signals can be provided in the same or different pairs of electromagnets of the radial stabilizer.

In the second method, a sine-wave or cosine-wave generator may be used to vary the setpoint of the controller.

Reference may be made to FIG. 1C, for example, from which it can be seen that the sine-wave is delivered to one controller 13a while the other controller 13a receives a cosine-wave setpoint signal, the actual value signals of the deviation from the setpoint being delivered by the units 13 and with two controllers 13' and 13".

In this case, the radial stabilizing coils will continuously tend to compensate for deviations from the setpoint values and in part displacements in the y and x direction. At the starting point shown, x-direction displacement will be on the offset from the original offset while the y displacement will be at a maximum and the axis of the core will orbit as represented at 38 the circular path 39 about the offset axis 37 in the direction of movement 40.

naturally, if a similar variation of the axis setpoint is not imposed upon upper radial stabilizer, the axis of the core will gyrate like a pendulum about the fixed axis defined by the intersection of the axis of the core and the plane of the upper radial stabilizer.

Its controller 131 receives the drive signal 43 rather than the drive signal 42 and the movement describes a circular orbit in the reverse sense.

Figure 2:
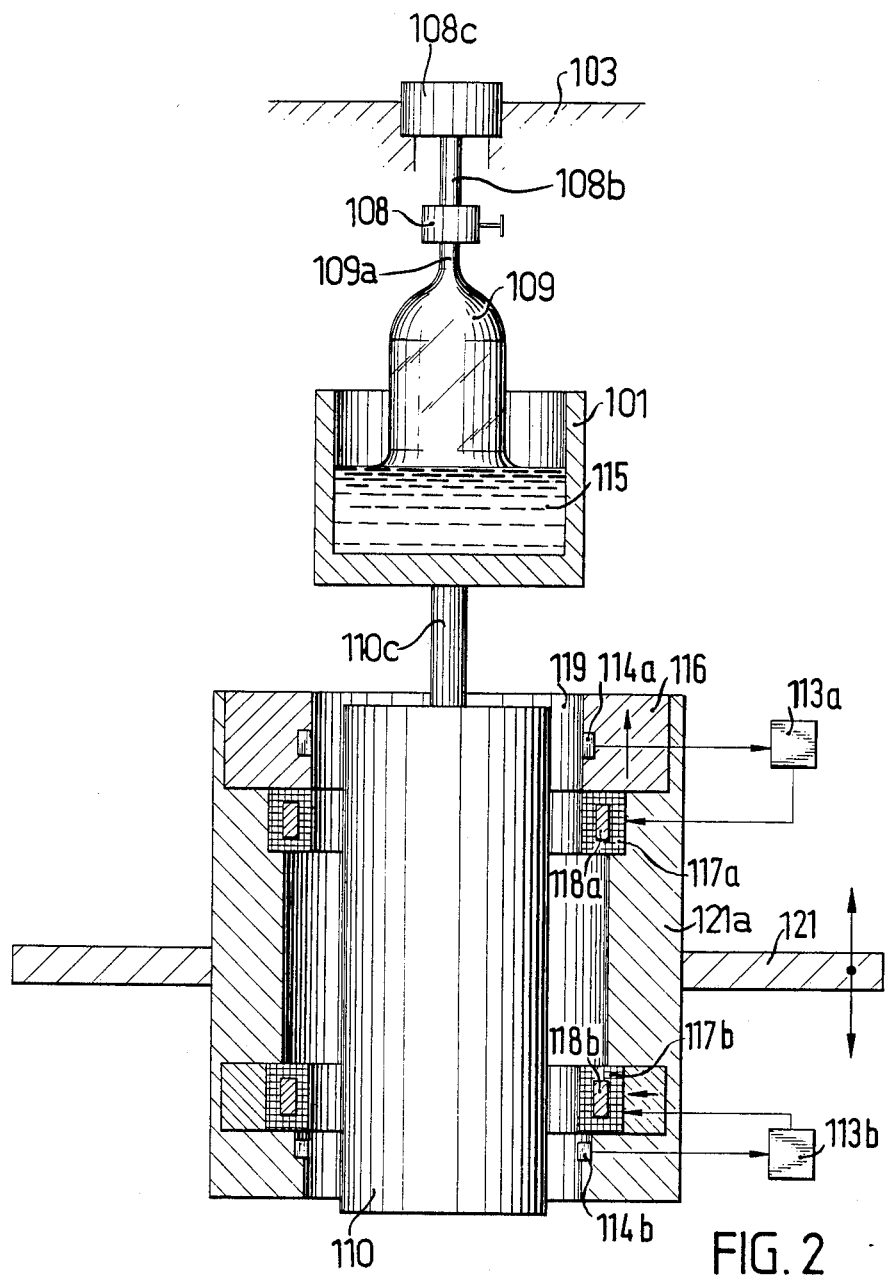
FIG. 2 is a similar view of an arrangement in which the element holding the seed crystal is fixed and the crucible is movable and the magnetic holder is provided for the crucible.

In FIG. 2 we have shown a kinematic reversal of the system of FIG. 1 wherein the crucible 101 is moved and not the crystal.

In this case, the crystal bar 109 is drawn from the melt 115 in the crucible 101 by progressively lowering the crucible while the crystal seed 109a and thus the growing crystal bar 109 are held stationary by a holder 108 or a rod 108b depending from a fixed support 108c on the carrier 103.

The core 110 is affixed to the crucible by a rod 110c and at its upper end cooperates with a permanent magnet 116 which functions as an axial stabilizing magnet and thus prevents the core from dropping uncontrolledly with respect to the housing 121a which is mounted on a plate 121. The latter can be lowered progressively to permit the crystal to grow by an appropriate vertical displacement device similar to that described in connection with FIG. 1.

Withing the housing 121a in which the annular permanent magnet 116 is provided, there is an annular coil 117a with a ferromagnetic core 118a controlled by the control unit 113a utilizing magnetic field plates 114a as sensors of the proximity of the core to the magnetic field plate.

The permanent magnet provides a radially directed premagnetization in the annular gap 119 and the field plate registers deviations in the magnetic field strength resulting from movements of the core toward or away from one of the field plates associated with an annular coil. A further radial stabilizing unit consists of the annular soil 117b, the respective core 118b, the magnetic field plate sensor 114b and the control unit 113b responsive to this sensor and provided proximal to the lower end of the magnetizable core.

The annular coils can correspond to those described in German patent document DE-OS No. 24 20 814.

The use of magnetic field plates as magnetic field sensors is described at page 123-173 of Galvanomagnetic Devices Data Book 1976/77, Siemens AG, Munich, Germany, it being noted that field plates are also referred to as magneto resistors.

Naturally, other magnetic field-detecting units can be used as well.

In FIG. 2, therefore, the crystal is drawn in the manner previously described except that instead of raising the crystal, the crucible is lowered and the crystal is held stationary. The heating unit for the crucible has not be shown in FIG. 2 and will not be seen in the subsequently described Figures either. It should be noted that a respective heating unit can be used as shown in FIG. 1. Depending upon the particular magnetic suspension and radial stabilizer used, therefore, either the crucible or the crystal can be magnetically suspended. The heater can be a high-frequency core instead of the resistance heater shown.

Figure 3:
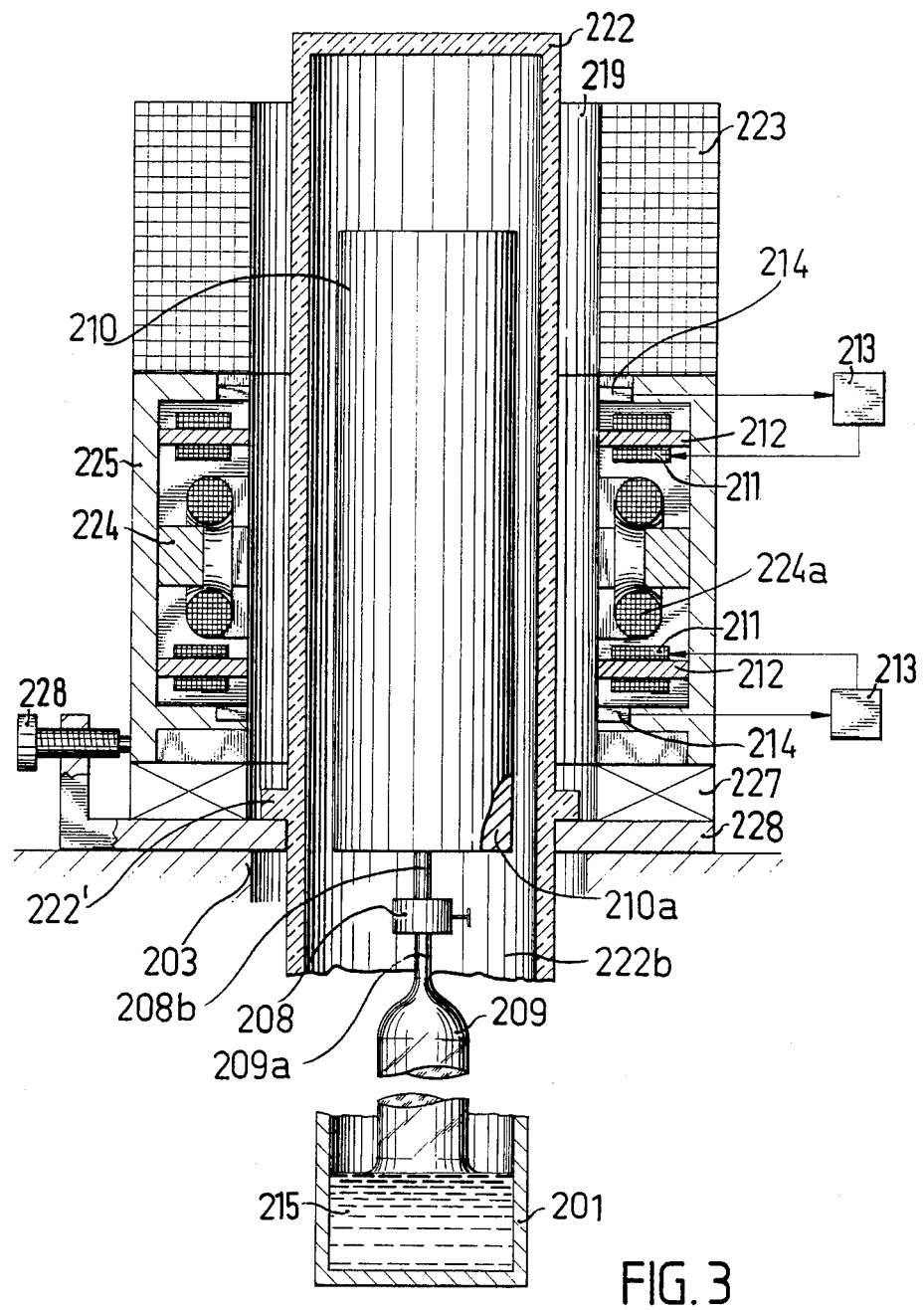
FIG. 3 is a diagrammatic and somewhat simplified axial section of another magnetic positioning holder for the crystal bar provided with a device for measuring the change of weight of the growing crystal.

In the embodiment of FIG. 3, a growth space or compartment is enclosed by the housing 222 which surrounds the growing crystal bar 209 which develops at the end of the rod 208 but to which the holder 208 for the seed 209a is affixed. The rod 208b is formed at the end of the magnetizable core 210 which is also surrounded by the housing 222 to enable the entire crystal-growing apparatus to operate at a high temperature. The core 210, therefore, likewise should be composed of a steel alloy which retains its magnetic properties at a high temperature and thus has a high Curie temperature.

By contrast, the electromagnet elements forming the radial stabilizers in axially spaced relationship are disposed externally of this housing 222.

The housing wall is thus provided in the annular gap 219 between the electromagnet and the core and at least in this region consists of a nonmagnetizable material, for example, quartz glass or a nonmagnetizable steel alloy.

The linear motor 223 is provided in the form of an annulus around the magnetizable core and acts in its working position upon the upper end of this core. The core is the subject of the radial stabilization effects of two radial stabilizing units each comprising a set of coils 211 with respective ferromagnetic cores 212, control units 213 and inductive sensors 14. A rotary field stator 224 is mechanically fixed to the stator support 225. The lower end of the stator support 225 lies directly upon a force-measuring unit 227 interposed between this stator support and a carrier 226 lying on the support structure 203. The member 226 also carries the housing 222 via its flange 222'.

It is possible to vertically fix the crucible 201 as shown for the crucible 1 in FIG. 1 and to vertically lift the core by magnetic force, i.e. the linear magnetic motor.

The linear motor can be composed of a simple coil retraction system wherein, for example, the core is progressively drawn into the coil to a degree determined by the electric current supplied to the coil 223 of the linear motor.

The length of the core 210 will therefore be established and the stroke of this core within the housing selected to permit the greatest length of crystal growth which is desired.

The rotary field stator 224 delivers to the magnetizable 210 a torque which sets this core and the crystal in rotation about their common vertical axis.

The energy required to rotate the crystal and the core is, however, minimal since bearings and sealing friction are eliminated.

By proper choice of material and the configuration of the magnetizable core in the region in which it is rotatably driven, synchronous motor (e.g. reluctance and hysteresis motor) or asynchronous motor (e.g. induction motor) principles may be used to rotate the core and the developing crystal.

When a hysteresis motor is formed by the stator 224 and its coil 224a, only cylindrical annular rotor elements of magnetizable steel are required. Because of the small driving power and hysteresis characteristics of this steel do not have to meet any special requirements so that the hysteresis motor portion of the core can be fabricated from the magnetizable steel of the core otherwise. As a consequence, the magnetizable core can be a continuous steel cylinder providing driving, centering and vertical displacement effects.

The weight of the stator externally of the housing 222 rests upon the force-measuring unit 227 and, since this stator is magnetically coupled to the core 210, neither the core itself nor the stator changes in weight during operation. The downward force exerted by the stator on the force-measuring unit 22 increases as a function in the change of weight of the crystal bar as it is grown.

It should be clear that this change of crystal growth weight is measured without any detrimental friction effect. When the force-measuring unit 227 consists of three force-measuring cells located at the vertices of an equilateral triangle, the addition of the three electrical outputs from these cells all represent the actual crystal growth free from nonsymmetrical or periodic perturbations resulting from wobble movements and vibration which are eliminated by cancellation.

Since the force-measuring cells are located entirely externally of the growth chamber 222b and thus all other thermal, corrosive and chamber-pressure dependent effects on the measurements are eliminated, the force-measuring unit can measure the crystal growth with time with a high degree of passage and accuracy.

The summation signal from the cells can, as described in the aforementioned copending application, and neither illustrated nor described in greater detail herein, be applied to an electrical comparator as the setpoint value input of the crystal bar diameter-control circuit. A setpoint representing the desired crystal bar diameter can be applied to this comparator as well and the difference signal applied to a controller which can, in a conventional manner, control the heating effect or the speed at which the crystal is drawn, or both, to adjust the diameter of the bar which is produced.

In the case in which corrosive substances can be released in the melting chamber, the magnetizable core can be provided with a corrosion-resistant coating which has been shown diagramatically at 210a in FIG. 3 and can be composed of quartz glass or graphite.

A setscrew 228 can be used to adjust the position of the stator 225 relative to the base plate 226 and the vessel 222 in the radial direction.

A plurality of such screws can be angularly equispaced around the stator to provide radial alignment of the crucible and crystal axis or a desired excentricity between these two axes if this is desired or required for the crystal growth process.

Figure 4:
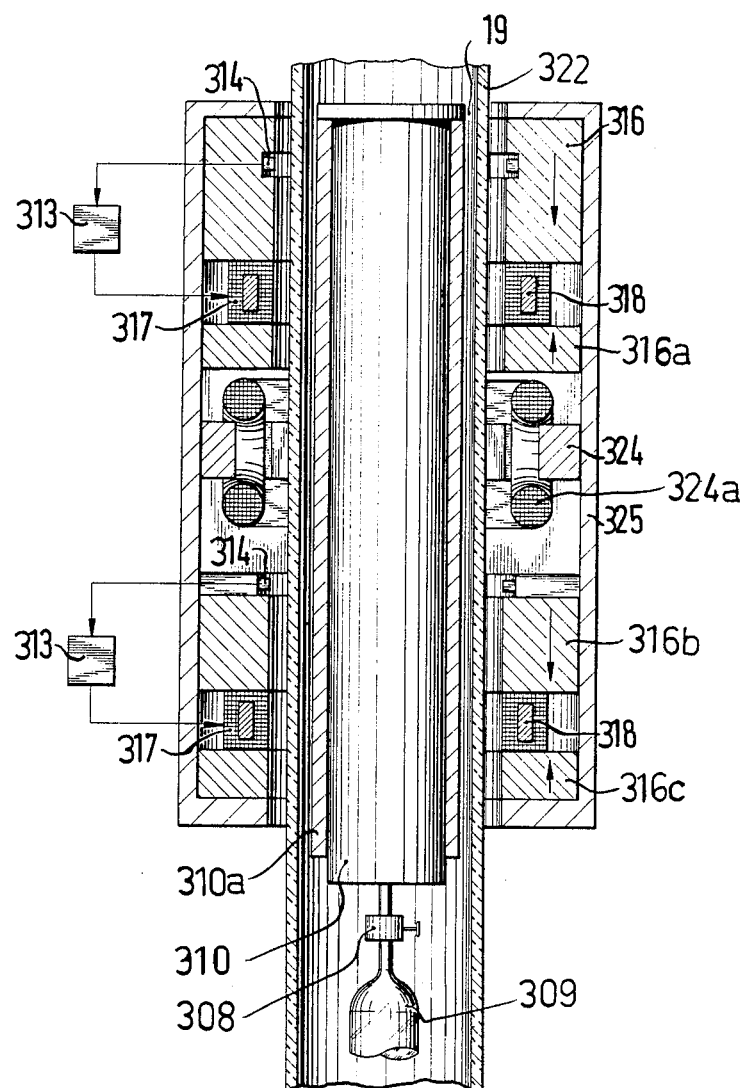
FIG. 4 is a diagrammatic and partial axial section of another embodiment of the holder of FIG. 3.

In FIG. 4 we have shown an embodiment which is functionally similar to that of FIG. 2 wherein the electromagnets of the radial stabilizing units are provided with a premagnetization in the annular gap 319 in the radial direction.

To this end, the annular coil 317 of the upper radial stabilizer unit is provided below the permanent magnet 316 forming the axial stabilizing magnet. Such an externally applied premagnetization can be, or course, electromagnetically effected although it has been found to be advantageous to use the permanent magnet 316 because this requires no supply of power, operates without introducing any perturbations and, because of its annular form, provides a well-defined stable central orientation of the axes in which radial magnetic forces acting upon the core are completely in balance.

The magnetic field forces which are applied to the magnetizable core increase as the product of the premagnetization and control field strengthens so that with correspondingly high permanent premagnetization field strengths, large dynamic stabilization forces can be generated over large gap widths (for example annular gap widths greater than 13 mm) with comparatively small electromagnetically generated control field strength.

In this embodiment as well, the growth path is enclosed in a housing 322 containing the growing crystal bar 309 which is engaged by the holder 308 attached to the lower end of the core 310. In this case, a corrosion-resistant covering or sheath 310a is seen in cross-section and protects the pressure part of the length of the core. The field plate induction sensors are provided at the gap 319 to free inputs to the controllers 313 of the radial stabilizers whose coils 317 lie between oppositely pole permanent magnets, one of which has been shown at 316 while others are shown at 316a, 316b and 316c, the arrows in these permanent magnets 316, 316a, 316b, 316c being directed in the direction of south to north polarization of the annular permanent magnets.

The outer housing or support 325 forms a stator with respect to which the stator member 324 carries the field coils 324a which can rotate the core 310 in the manner previously described.

The crucible (not shown) can be lowered using the configuration of FIG. 2 or the stator 325 can be raised utilizing the construction of FIG. 1 to draw the crystal from the melt.

Figure 5:
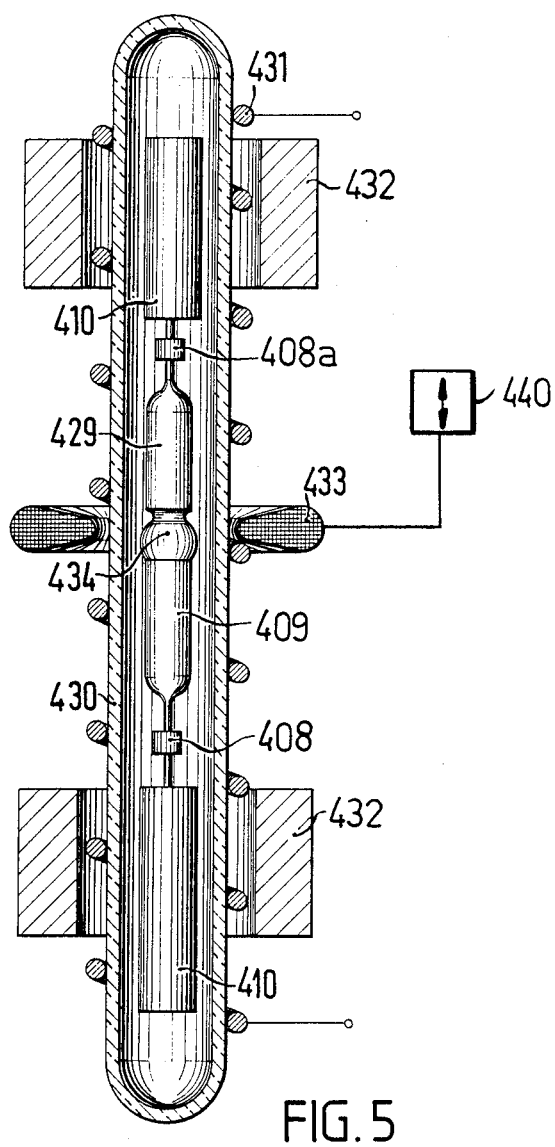
FIG. 5 is an axial section through a zone-melting apparatus according to the invention.

FIG. 5 shows the principles of the invention applied to an embodiment in which zone melting is carried out, i.e. wherein the bar 429 of the crystallizable substance is held with magnetic radial stabilization in accordance with the principles of the invention as the bar is drawn through the heating zone in which melting followed by cooling occurs.

On the opposite side of the heating and cooling zone a crystalline bar 409 of the product is formed. The crystal bar 409 is retained in a holder 408 while the supply bar 429 is retained in a holder 408a, each of the holders 408, 408a being affixed in the manner previously described, to a respective hollow cylindrical magnetizable core 410.

The growth chamber is here formed as a hermetically sealed cylindrical enclosure or ampule 430 which can be composed in whole or in part of quartz and which, although shown in one piece in FIG. 5, may be assembled from two or more parts which are joined together.

The temperature of the housing and growth chamber is controlled by a heating coil 437 while the melting zone is defined by a generally toroidal induction coil 433 surrounding the housing.

The magnetic suspension and radial orientation units are here represented only in outline form at 432 for each of the cores 410, it being understood that each of the units 432 can include a pair of radial stabilizers as illustrated in the embodiment of FIG. 4 together with means for shifting the entire assembly of housing and stabilizers axially relative to the torroidal core 433 or for moving the torroidal core 433 progressively along the housing 430 with the housing stationary. This, of course, moves the melting and cooling zone 434 progressively along the rod or bar 429 to allow the formation and growth of the crystal 409.

The means for this purpose has been represented diagrammatically at 440.

Naturally the diagrammatic illustration of FIG. 5 does not shown many of the other elements which necessarily would be used in conjunction with the device, such as means for shielding the device against undesired incursion of heat, for preventing loss of heat or for cooling portions of the device which may become overheated.

Using the system of FIG. 4 in each of the units 432, the assembly of the cores 410 and the bar 409, 429 can be set into rotation as well as adjusted with respect to orientation of the axes via the radial adjustment means formed by the sensors, controllers and radial stabilizing coils.

In each of the embodiments of FIGS. 2-5, therefore, the radial stabilizing unit 111, 211, 311 or 411 and its controller 113, 213, 313 and 413 can employ the circuitry shown in FIGS. 1B and 1C to impose gyratory, orbital or other complex movements upon the interface.

We claim:

1. An apparatus for producing a crystalline body which comprises:
    means for supporting a bar member upon which crystallizable material can form a crystal from a melt of said material derived from a source member positioned to form a crystallization interface with said bar member and for moving said members relatively in a generally axial direction to effect growth of said crystal;
    means for magnetically suspending at least one of said members so that a generally axial displacement thereof can be effected in a substantially frictionless manner, and including a magnetizable core connected with said one of said members;
    a radial stabilizer for magnetically stabilizing said core and including an array of electromagnets providing an annular gap between said core and said array, a position sensor for detecting the position of said core with respect to said array, and an electrical controller responsive to said position sensor for controlling electrical energization of said electromagnets in response to a detected position of said core; and
    means for applying a signal to said controller to impart transverse displacement to said core by controlled energization of said electromagnets to effect relative displacement of said members and intimate mixing of said melt at said interface.

2. The apparatus defined in claim 1 wherein said electrical controller includes a comparator having an actual-valve input from said position sensor and a setpoint-value input, said means for applying a signal including a harmonic-signal generator connected to said setpoint-value input.

3. An apparatus for producing a crystalline body which comprises:
    means for supporting a bar member upon which crystallizable material can form a crystal from a melt of said material derived from a source member positioned to form a crystallization interface with said bar member and for moving said members relatively in a generally axial direction to effect growth of said crystal;
    means for magnetically suspending at least one of said members so that a generally axial displacement thereof can be effected in a substantially frictionless manner, and including a magnetizable core connected with said one of said members; and
    means for inducing controlled transverse relative displacement of said members and including:
    an array of electromagnets providing an annular gap between said core and said array,
    a position sensor for detecting the position of said core with respect to said array,
    a comparator having an actual-value input connected to said position sensor and a setpoint-value input, and
    a sine-wave or cosine-wave generator connected to said setpoint-value input to impart transverse displacement to said core by controlled energization of said electromagnets to effect relative displacement of said members and intimate mixing of said melt at said interface.

* * * * *